(12) United States Patent
Kanesaka

(10) Patent No.: US 7,792,167 B2
(45) Date of Patent: Sep. 7, 2010

(54) LIGHT SOURCE DRIVING APPARATUS AND LIGHT SOURCE DRIVING METHOD

(75) Inventor: Hiroki Kanesaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 12/340,723

(22) Filed: Dec. 21, 2008

(65) Prior Publication Data

US 2009/0201956 A1    Aug. 13, 2009

(30) Foreign Application Priority Data

Dec. 21, 2007    (JP) ............... 2007-330464

(51) Int. Cl.
*H01S 3/00*    (2006.01)
(52) U.S. Cl. ............... 372/38.07; 372/38.01
(58) Field of Classification Search ............. 372/38.07, 372/29.08, 29.01, 38.02; 347/131
See application file for complete search history.

(56) References Cited

U.S. PATENT DOCUMENTS 4,924,170 A * 5/1990 Henze ................. 323/272
5,513,089 A * 4/1996 Sudo et al. ............... 363/21.11
6,100,667 A * 8/2000 Mercer et al. ............ 320/137

FOREIGN PATENT DOCUMENTS

| JP | 1993-335664 A | 12/1993 |
| JP | 1997-246646 A | 9/1997 |
| JP | 1997-326522 A | 12/1997 |

* cited by examiner

*Primary Examiner*—Minsun Harvey
*Assistant Examiner*—Tuan Nguyen
(74) *Attorney, Agent, or Firm*—Fujitsu Patent Center

(57) ABSTRACT

A light source driving apparatus, which adjusts a bias current to be supplied so as to control intensity of a light source, comprises a power source which outputs a variable reference voltage; a light receiving unit which receives light output from the light source and converts the light into an electric signal; a bias supply unit which supplies a bias current, which is based on an intensity control signal according to the electric signal converted by the light receiving unit and the reference voltage output from the power source, to the light source; and a voltage control unit which acquires information about intensity characteristics with respect to the intensity control signal of the light source and controls the reference voltage according to the acquired information about the intensity characteristics.

3 Claims, 13 Drawing Sheets

US 7,792,167 B2

LIGHT SOURCE DRIVING APPARATUS AND LIGHT SOURCE DRIVING METHOD

CROSS-REFERENCE TO RELATED APPLICATION

This application is based upon and claims the benefit of priority of the prior Japanese Patent Application No. 2007-330464, filed on Dec. 21, 2007, the entire contents of which are incorporated herein by reference.

BACKGROUND OF THE INVENTION

1. Field of the Invention

The present application relates to a light source driving apparatus that adjusts a bias current to be supplied so as to control intensity of a light source, and a light source driving method.

2. Description of the Related Art

Conventionally, an LD (Laser Diode) which outputs light according to an electric input is used for light sources such as light transmitting apparatuses in optical communication systems. Further, auto power control (APC) is used. With the auto power control, output light from the LD is received by a PD (Photo Diode), and intensity of the output light from the LD is controlled based on an electric signal output from the PD.

The auto power control is normally made by supplying a bias current obtained by multiplying an intensity control signal based on the electric signal output from the PD by a reference voltage to the LD (for example, see Japanese Patent Application Laid-Open Nos. 5-335664, 9-326522 and 9-246646). The light source, which outputs a light signal, uses extinction ratio control for steadily controlling an extinction ratio of the output light from the LD based on the electric signal output from the PD. The extinction ratio control is normally made by supplying a pulse current obtained by multiplying an extinction ratio control signal based on the electric signal output from the PD by a reference signal to the LD.

In the above conventional technique, however, an intensity characteristic of light of a driving current of the LD (hereinafter, "differential efficiency") changes according to temperature fluctuation of the LD and fluctuation due to aging such as deterioration of elements. Therefore, a unit change amount of the intensity of the output light from the LD at the time of changing the intensity control signal changes due to factors such as the temperature fluctuation of the LD. Furthermore, a unit change amount of the extinction ratio of the signal light at the time of changing the extinction ratio control signal changes according to the temperature of the LD. For this reason, the intensity control and the extinction ratio control of the LD cannot be stabilized. This problem is described in detail below.

FIG. 11 is a graph illustrating a relationship between the driving current of the LD and the intensity of the output light. In FIG. 11, an abscissa axis shows the driving current [mA] to be supplied to the LD. An ordinate axis shows the intensity Pf [μW] of the output light from the LD. Characteristic lines 1111, 1112, and 1113 represent characteristics of the intensity Pf with respect to the driving current at the time when the temperature of the LD is −5° C., 25° C., and 80° C., respectively.

As shown by the characteristic lines 1111 to 1113, when the temperature of the LD changes, the intensity characteristic with respect to the driving current of the LD changes. A thick line 1120 represents a desirable average intensity (Pave) of the output light from the LD. A dotted line 1131 shows desirable intensity (Plow) at the time when the output light is "0" (extinction state). A dotted line 1132 represents desirable intensity (Phigh) at the time when the output light is "1" (light-emitting state).

The driving current to be supplied to the LD includes a bias current and a pulse current. The bias current is a driving current which determines the average intensity of the output light from the LD. A reference symbol 1141 represents the bias current which changes the average intensity of the output light from the LD into desirable average intensity 1120 when the temperature of the LD is 80° C.

The pulse current is a driving current which determines the intensity at the time when the output light from the LD is "0" and the intensity at the time when the output light from the LD is "1" (extinction ratio). A reference symbol 1142 represents a pulse current which changes the intensity at the time of the output light "0" and the intensity at the time of the output light "1" into desirable intensity 1131, and into desirable intensity 1132 when the temperature of the LD is 80° C.

FIG. 12 is a graph illustrating control of the driving current for stabilizing the average intensity and the extinction ratio. In FIG. 12, an abscissa axis represents the temperature [° C.] of the LD. An ordinate axis represents the driving current [mA] to be supplied to the LD. A characteristic line 1210 represents a relationship between the temperature of the LD and a control value of the bias current according to the temperature of the LD. A characteristic line 1220 represents a relationship between the temperature of the LD and a control value of the pulse current according to the temperature of the LD. As shown by characteristic lines 1210 and 1220, the bias current and the pulse current to be supplied to the LD are controlled according to the temperature fluctuation of the LD, so that the average intensity and the extinction ratio of the output light from the LD are stabilized.

FIG. 13 is a graph illustrating a relationship between a control signal and the intensity of the output light. In FIG. 13, an abscissa axis represents a code DAC_code [LSB] of a control signal. Characteristic lines 1311, 1312, and 1313 represent characteristics of the intensity Pf with respect to the control signal at the time when the temperature of the LD is −5° C., 25° C., and 80° C., respectively.

The control signal is a digital signal which controls the output light from the LD. The control signal includes an intensity control signal which controls the average intensity of the output light from the LD, and an extinction ratio control signal which controls the extinction ratio of the output light from the LD. The driving current to be supplied to the LD is generated by multiplying a constant reference voltage by the control signal.

As shown in FIG. 11, when the temperature of the LD changes, the intensity characteristics with respect to the driving current of the LD changes. Therefore, as shown by characteristic lines 1311 to 1313, when the temperature of the LD changes, the intensity change amount of the output light from the LD at the time of changing the control signal changes merely by a minimum unit (1LSB: Least Significant Bit).

Specifically, as shown by the characteristic line 1311, when the temperature of the LD is low (−5° C.), the change amount per the control signal 1LSB is larger than the case where the temperature of the LD is high (80° C.) as shown by the characteristic line 1313. For this reason, accuracy of the intensity control using the intensity control signal and the extinction ratio control using the extinction ratio control signal change according to the temperature fluctuation of the LD, and thus the intensity control and the extinction ratio control of the LD cannot be stabilized.

In order to improve the accuracy of the intensity control, an analog converter which multiples the reference voltage by the control signal is provided with a high resolution so that the unit change amount of the control signal can be reduced. However, since the analog converter having the high resolution is expensive, the cost of the apparatus increases.

When the extinction ratio control is conducted, information about differential efficiency of the LD is may be acquired from temperature information about the LD acquired from a temperature sensor. In this case, a value of the extinction ratio control signal that makes the extinction ratio of the output light constant is calculated according to the acquired information of the differential efficiency of the LD. In this case, however, the information of the temperate characteristics of the differential efficiency of the respective LDs should be acquired in advance. For this reason, the steps of manufacturing the apparatus increases and thus manufacturing becomes complicated. Since a temperature sensor needs to be provided, the apparatus is enlarged which increases costs.

In order to address the above problems of the conventional technique, it is an aspect of the present invention to provide a light source driving apparatus and a light source driving method which can provide stable control of the intensity of a light source.

SUMMARY

A light source driving apparatus, which adjusts a bias current to be supplied so as to control intensity of a light source, comprises a power source which outputs a variable reference voltage; a light receiving unit which receives light output from the light source and converts the light into an electric signal; a bias supply unit which supplies a bias current, which is based on an intensity control signal according to the electric signal converted by the light receiving unit and the reference voltage output from the power source, to the light source; and a voltage control unit which acquires information about intensity characteristics with respect to the intensity control signal of the light source and controls the reference voltage according to the acquired information about the intensity characteristics.

DETAILED DESCRIPTION OF THE EMBODIMENTS

A light source driving apparatus and a light source driving method according to preferred embodiments of the present invention are described in detail below with reference to the accompanying drawings.

Embodiments

Figure 1:
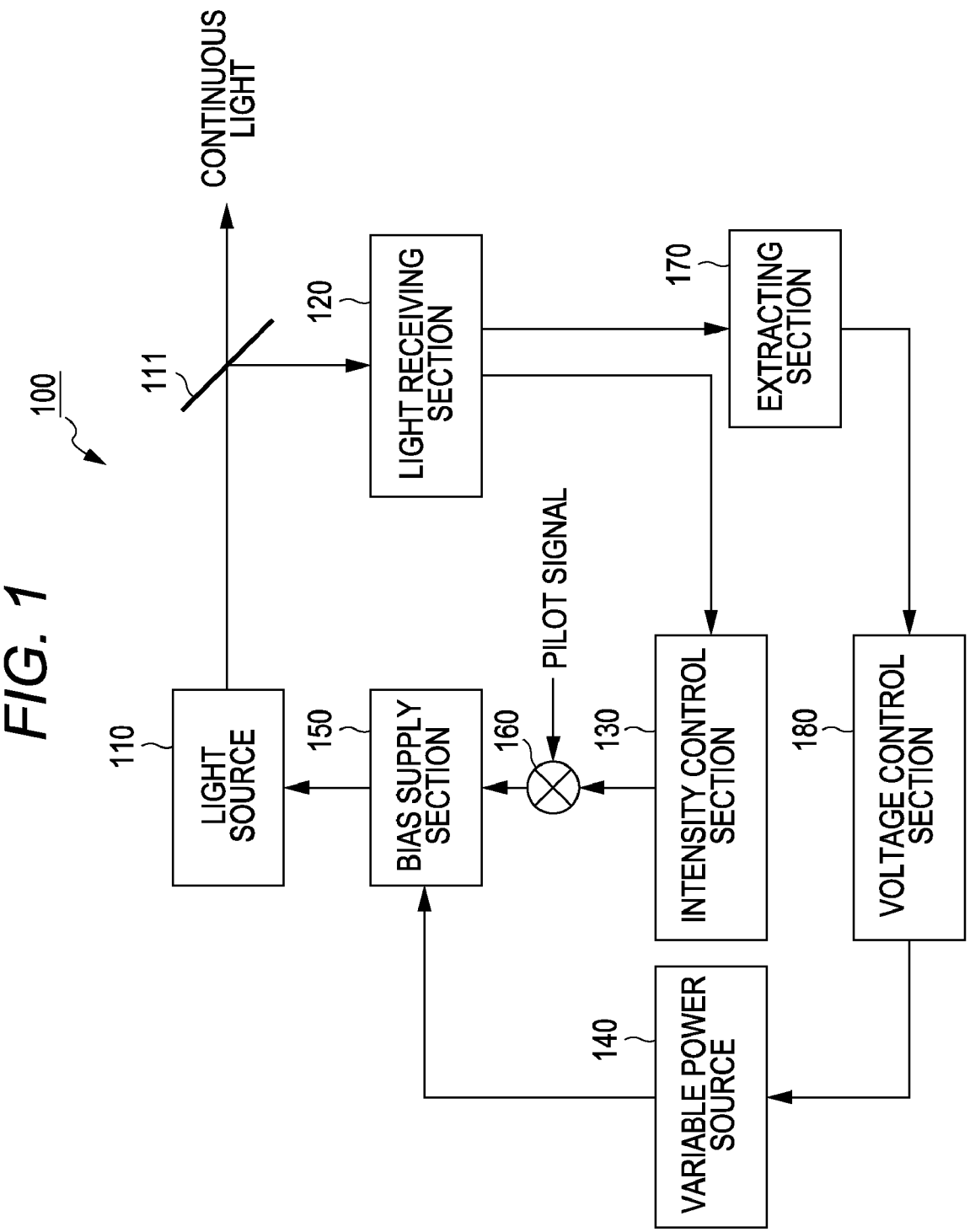
FIG. 1 is a block diagram illustrating a functional structure of a light source driving apparatus according to a first embodiment.

FIG. 1 is a block diagram illustrating a functional structure of the light source driving apparatus according to a first embodiment. As shown in FIG. 1, the light source driving apparatus 100 according to the first embodiment has a light source 110, a branching section 111, a light receiving section 120, an intensity control section 130, a variable power source 140, a bias supply section 150, a superimposing section 160, an extracting section 170, and a voltage control section 180. The light source driving apparatus 100 according to the first embodiment outputs continuous light using the light source 110 and controls intensity of the output light.

The light source 110 outputs light with intensity according to a bias current supplied from the bias supply section 150 (average intensity). The light source 110 outputs continuous light. The branching section 111 deflects a part of the light output from the light source 110 to the light receiving section 120. The light receiving section 120 receives the light output from the branching section 111 so as to convert the light into an electric signal. The light receiving section 120 outputs the converted electric signal to the intensity control section 130 and the extracting section 170.

The intensity control section 130 conducts automatic power control for controlling the intensity of the output light from the light source 110 based on the electric signal output from the light receiving section 120. Specifically, the intensity control section 130 outputs an intensity control signal according to the electric signal output from the light receiving section 120 to the bias supply section 150 via the superimposing section 160. The intensity control signal is a digital signal according to the electric signal output from the light receiving section 120.

The intensity control signal 130 adjusts a value of the intensity signal so that the intensity of the electric signal output from the light receiving section 120 becomes essentially constant, and controls the intensity of the output light from the light source 110 to keep the intensity essentially constant. For example, when the intensity of the electric signal output from the light receiving section 120 is lower than a desirable intensity, the intensity control section 130 increases the value of the intensity control signal output to the bias supply section 150. When the intensity of the electric signal is higher than the desirable intensity, the intensity control section 130 decreases the value of the intensity control signal.

The variable power source 140 outputs a reference voltage to be a standard of the bias current to the bias supply section 150. The reference voltage output from the variable power source 140 is variable. The variable power source 140 changes the reference voltage output according to control of the voltage control section 180.

The bias supply section 150 supplies, to the light source 110, a bias current based on the intensity control signal output from the intensity control section 130 and on the reference voltage output from the variable power supply 140. The bias supply section 150 multiplies the reference voltage output from the variable power source 140 by the intensity control signal output from the intensity control section 130 so as to generate a bias current, and supplies the generated bias current to the light source 110.

The superimposing section 160 and the extracting section 170 acquire information relating to intensity characteristics with respect to the intensity control signal of the light source 110. The intensity characteristics with respect to the intensity control signal of the light source 110 represent how much the intensity of the output light from the light source 110 changes with respect to the unit change amount 1LSB of the intensity control signal output from the intensity control section 130 to the bias supply section 150. The information relating to the intensity characteristics is information about the intensity characteristics themselves or information correlated with the intensity characteristics.

The superimposing section 160 superimposes a signal with a frequency different from that of the intensity control signal on the intensity control signal output from the intensity control section 130 to the bias supply section 150. The superimposing section 160 superimposes a pilot signal with frequency f0 that is lower than the intensity control signal on the intensity control signal. The pilot signal may be, for example, an alternating signal of "0, 1, 0, 1, . . . ".

The extracting section 170 extracts a component of the frequency f0 from the electric signal output from the light receiving section 120. The intensity of the electric signal extracted by the extracting section 170 changes with the frequency f0 according to a value of the pilot signal superimposed on the intensity control signal. An amplitude of this electric signal has a correlation with the intensity characteristics of the intensity control signal of the light source 110. The extracting section 170 outputs the extracted electric signal as information about the intensity characteristics of the light source 110 to the voltage control section 180.

The voltage control section 180 controls the reference voltage output from the variable power source 140 based on the information about the intensity characteristics with respect to the intensity control signal of the light source 110 output from the extracting section 170. Specifically, the voltage control section 180 controls the reference voltage from the variable power source 140 so that the amplitude of the electric signal output from the extracting section 170 becomes essentially constant. For example, when the amplitude of the electric signal output from the extracting section 170 is smaller than a desirable amplitude, the voltage control section 180 increases the reference voltage. When the amplitude of the electric signal is larger than the desirable amplitude, the voltage control section 180 decreases the reference voltage.

In the light source driving apparatus 100 according to the first embodiment, the information about the intensity characteristics with respect to the intensity control signal of the light source 110 is acquired, and the reference voltage is controlled based on the acquired information. As a result, the intensity characteristics of the intensity control signal of the light source 110 can be kept essentially constant. For this reason, even when the intensity characteristics with respect to the bias current change due to a temperature fluctuation, the intensity of the light source 110 can be stabilized by the intensity control signal.

The pilot signal with frequency f0 is superimposed on the intensity control signal, and the component of the frequency f0 is extracted from the electric signal output from the light receiving section 120. As a result, the information about the intensity characteristics of the intensity control signal of the light source 110 can be acquired. For this reason, the information about the intensity characteristics of the intensity control signal of the light source 110 can be acquired without using a temperature monitor or the like which acquires the temperature information about the light source 110. Thus, the enlargement of the apparatus and the increase in the cost are reduced, and the intensity control of the light source 110 can be stabilized.

The reference voltage of the variable power source 140 is controlled so that the amplitude of the electric signal extracted by the extracting section 170 becomes essentially constant. As a result, the intensity characteristics with respect to the intensity control signal of the light source 110 can be essentially constant. For this reason, the intensity control of the light source 110 can be stabilized by simple control without acquiring the temperature information about the light source 110 and without calculating the intensity characteristics of the intensity control signal of the light source 110 based on the acquired information.

Second Embodiment

Figure 2:
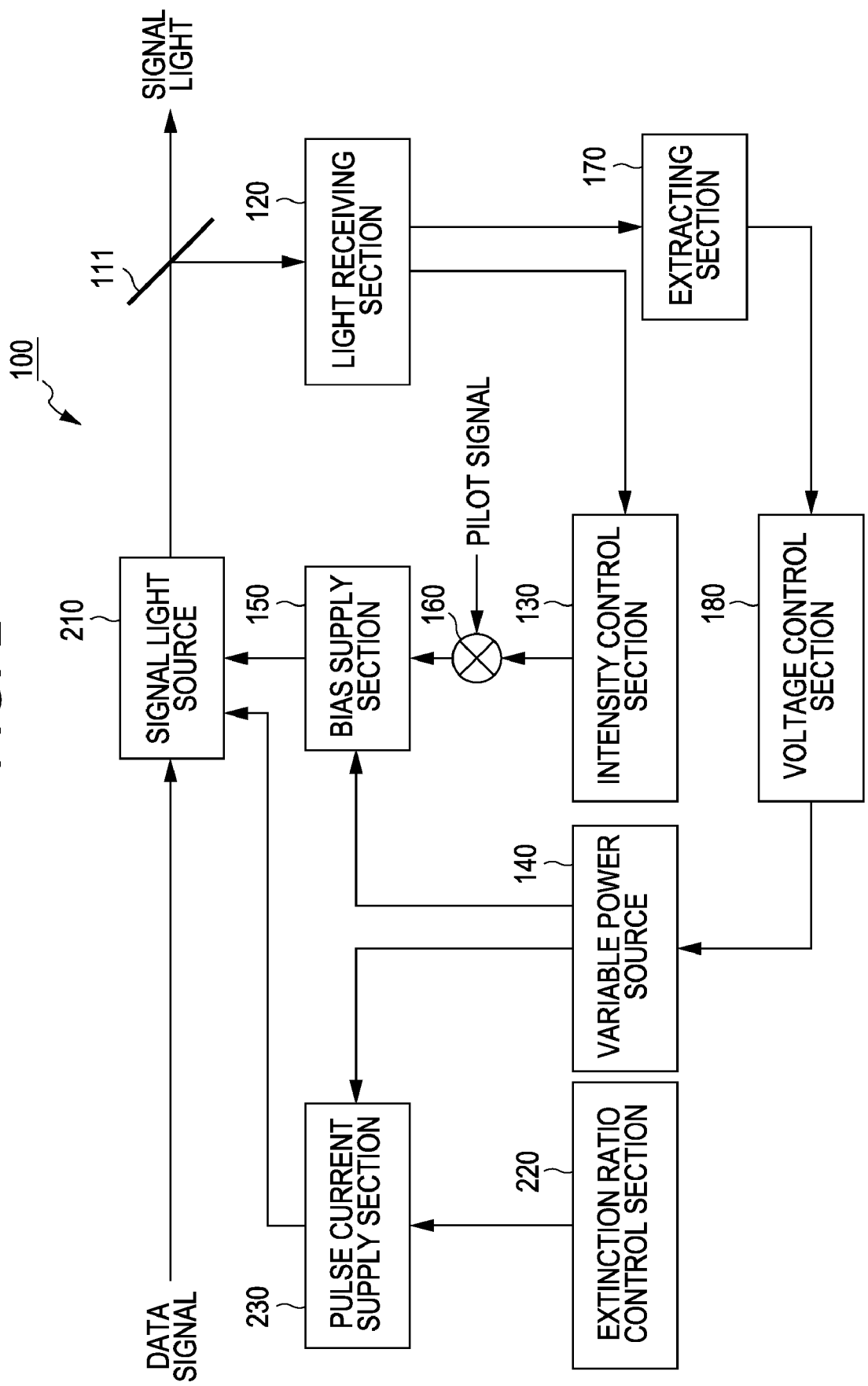
FIG. 2 is a block diagram illustrating a functional structure of the light source driving apparatus according to a second embodiment.

FIG. 2 is a block diagram illustrating a functional structure of the light source driving apparatus according to a second embodiment. In FIG. 2, the structure similar to that shown in FIG. 1 is denoted by the same reference symbols and the description thereof is omitted. As shown in FIG. 2, the light source driving apparatus 100 according to the second embodiment has a signal light source 210, an extinction ratio control section 220, and a pulse current supply section 230.

The light source driving apparatus 100 according to the second embodiment outputs signal light using the signal light source 210, and controls the intensity of the output light and the extinction ratio. The variable power source 140 outputs a reference voltage to the bias supply section 150 and the pulse current supply section 230. The reference voltage output from the variable power source 140 to the pulse current supply section 230 is a voltage in common to the reference voltage output from the variable power source 140 to the bias supply section 150.

The signal light source 210 outputs a light signal according to a data signal input from the outside. For example, the signal light source 210 switches the light signal between ON/OFF ("1"/"0") based on the input data signal. The signal light source 210 outputs a light signal with extinction ratio according to a pulse current supplied from the pulse current supply section 230.

The extinction ratio control section 220 controls an extinction ratio of the light signal output from the signal light source 210. Specifically, the extinction ratio control section 220 outputs an extinction ratio control signal to the pulse current supply section 230. The extinction ratio control signal is a digital signal for controlling the extinction ratio of the light signal output from the signal light source 210. The extinction ratio control section 220 outputs the fixed extinction ratio control signal regardless of a change in the intensity characteristics with respect to the control signal of the signal light source 210 due to a temperature change.

The pulse current supply section 230 supplies a pulse current, which is based on the extinction ration control signal output from the extinction ration control section 220 and the reference voltage output from the variable power source 140, to the signal light source 210. Specifically, the pulse current supply section 230 multiplies the reference voltage output from the variable power source 140 by the extinction ratio control signal output from the extinction ratio control section 220 so as to generate the pulse current, and supplies the generated pulse signal to the signal light source 210.

Figure 3:
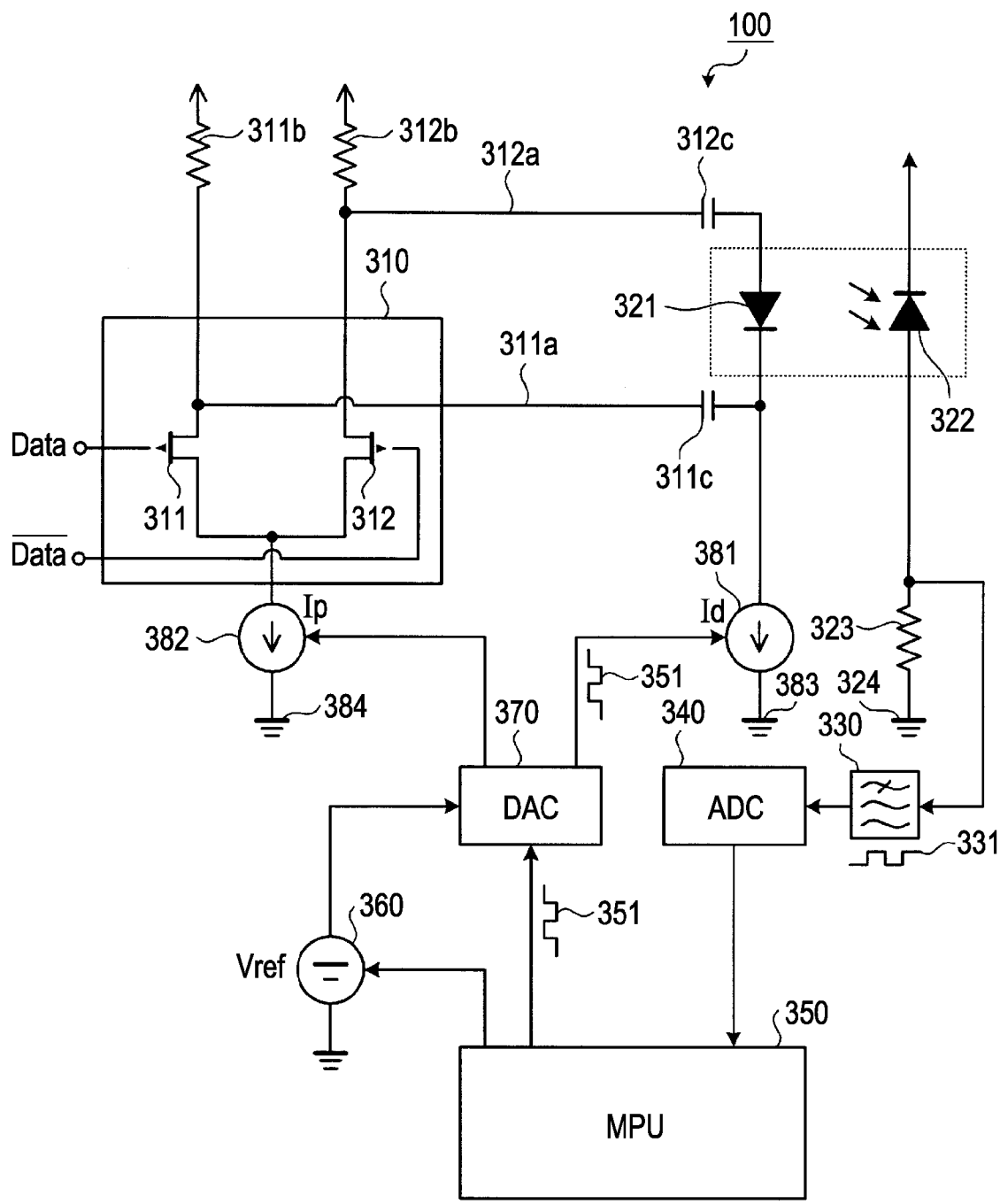
FIG. 3 is a circuit diagram illustrating a detailed example of the light source driving apparatus shown in FIG. 2.

FIG. 3 is a circuit diagram illustrating a detailed example of the light source driving apparatus shown in FIG. 2. As shown in FIG. 3, the light source driving apparatus 100 shown in FIG. 2 has a switch section 310, an LD 321, an MPD 322, a low-pass filter 330, a digital converter 340, an MPU 350, a variable power source 360, an analog converter 370, a bias current driving section 381, and a pulse current driving section 382.

The switch section 310 and the LD 321 realize a function of the signal light source 210 shown in FIG. 2. The switch section 310 has a switch 311 and a switch 312. A pulse current output from the pulse current driving section 382 is input into the switches 311 and 312. A data signal and an inverted data signal are input into the switches 311 and 312, respectively.

When the data signal input into the switch 311 is "1," a pulse current is output from the switch 311 (path 311a), and when the data signal is "0," a pulse current is output from the switch 312 (path 312a). A resistor 311b and a capacitor 311c are connected to the path 311a. A resistor 312b and a capacitor 312b are connected to the path 312a. The capacitors 311c and 312c are high-pass filters which eliminate DC components (low-frequency components) of the pulse currents.

When the pulse current is output from the path 311a of the switch section 310, the LD 321 outputs light with an intensity obtained by adding the pulse current to a bias current supplied from the bias current driving section 381 (light-emitting state). On the other hand, when the pulse current is output from the path 312a of the switch section 310, the LD 321 outputs light with intensity obtained by subtracting the pulse current from the bias current supplied from the bias current driving section 381 (extinct state).

The MPD 322 (Monitoring Photo Diode) realizes a function of the light receiving section 120 shown in FIG. 2. The MPD 322 and the LD 321 are modularized as shown by a dotted line, and the MPD 322 is provided as a back power monitor of the LD 321. The MPD 322 receives output light from the LD 321 and converts the light into an electric signal. The MPD 322 outputs the converted electric signal into the low-pass filter 330. A ground section 324 and a resistor 323 are connected to a path through which the electric signal is output from the MPD 322 to the low-pass filter 330.

The low-pass filter 330 realizes a function of the extracting section 170 shown in FIG. 2. The low-pass filter 330 allows only an electric signal 331 with a frequency component of not more than f0 in the electric signal output from the MPD 322 to pass and then outputs the signal to the digital converter 340. The digital converter 340 (ADC: Analog Digital Converter) digitally converts the electric signal 331 output from the low-pass filter 330 and then outputs the signal to the MPU 350.

The MPU 350 (Micro Processing Unit) realizes a function of the intensity control section 130 shown in FIG. 2. The MPU 350 acquires an average value of the electric signal 331 output from the digital converter 340. The MPU 350 outputs an intensity control signal according to the acquired average value of the electric signal 331 to the analog converter 370 (DAC: Digital Analog Converter). The MPU 350 adjusts the value of the intensity control signal so that the average value of the electric signal 331 to be acquired becomes essentially constant.

Furthermore, the MPU 350 realizes a function of the extinction ratio control section 220 shown in FIG. 2. The MPU 350 outputs the extinction ratio control signal to the analog converter 370. The intensity of the pulse current input into the LD 321 changes according to the extinction ratio control signal output from the MPU 350 to the analog converter 370. The MPU 350 keeps the value of the extinction ratio control signal output to the analog converter 370 essentially constant.

Furthermore, the MPU 350 realizes a function of the superimposing section 160 shown in FIG. 2. The MPU 350 generates a pilot signal 351 with frequency f0. The MPU 350 superimposes the generated pilot signal 351 on the intensity control signal output to the analog converter 370. Since the pilot signal 351 can be generated by the MPU 350 with software, a part such as an oscillator does not need to be additionally provided.

The MPU 350 realizes a function of the voltage control section 180 shown in FIG. 2. The MPU 350 acquires an amplitude of the electric signal 331 output from the digital converter 340. The MPU 350 controls the reference voltage output from the variable power source 360 so that the amplitude of the electric signal 331 acquired becomes essentially constant. The variable power source 360 has the similar structure to that of the variable power source 140 shown in FIG. 2. The variable power source 360 outputs the reference voltage to the analog converter 370. The variable power source 360 changes the reference voltage output due to the control of the MPU 350.

The analog converter 370 (DAC: Digital Analog Converter) and the bias current driving section 381 realize functions of the bias supply section 150 shown in FIG. 2. A ground section 383 is connected to the bias current driving section 381. The analog converter 370 multiples the reference voltage output from the variable power source 360 by the intensity control signal output from the MPU 350 so as to convert the intensity control signal into an analog signal.

The analog converter 370 outputs the analog-converted intensity control signal to the bias current driving section 381. The bias current driving section 381 converts a voltage of the intensity control signal output from the analog converter 370 into an electric current. The bias current driving section 381 outputs the converted intensity control signal as the bias current to the LD 321.

The analog converter 370 and the pulse current driving section 382 realize functions of the pulse current supply section 230 shown in FIG. 2. A ground section 384 is connected to the pulse current driving section 382. The analog converter 370 multiplies the reference voltage output from the variable power source 360 by the extinction ratio control signal output from the MPU 350 so as to convert the extinction ratio control signal into an analog signal.

The analog converter 370 outputs the analog-converted extinction ratio control signal to the pulse current driving section 382. The pulse current driving section 382 converts a voltage of the extinction ratio control signal output from the analog converter 370 into an electric current. The pulse current driving section 382 outputs the converted intensity control signal as a pulse current to the switch section 310.

Figure 4:
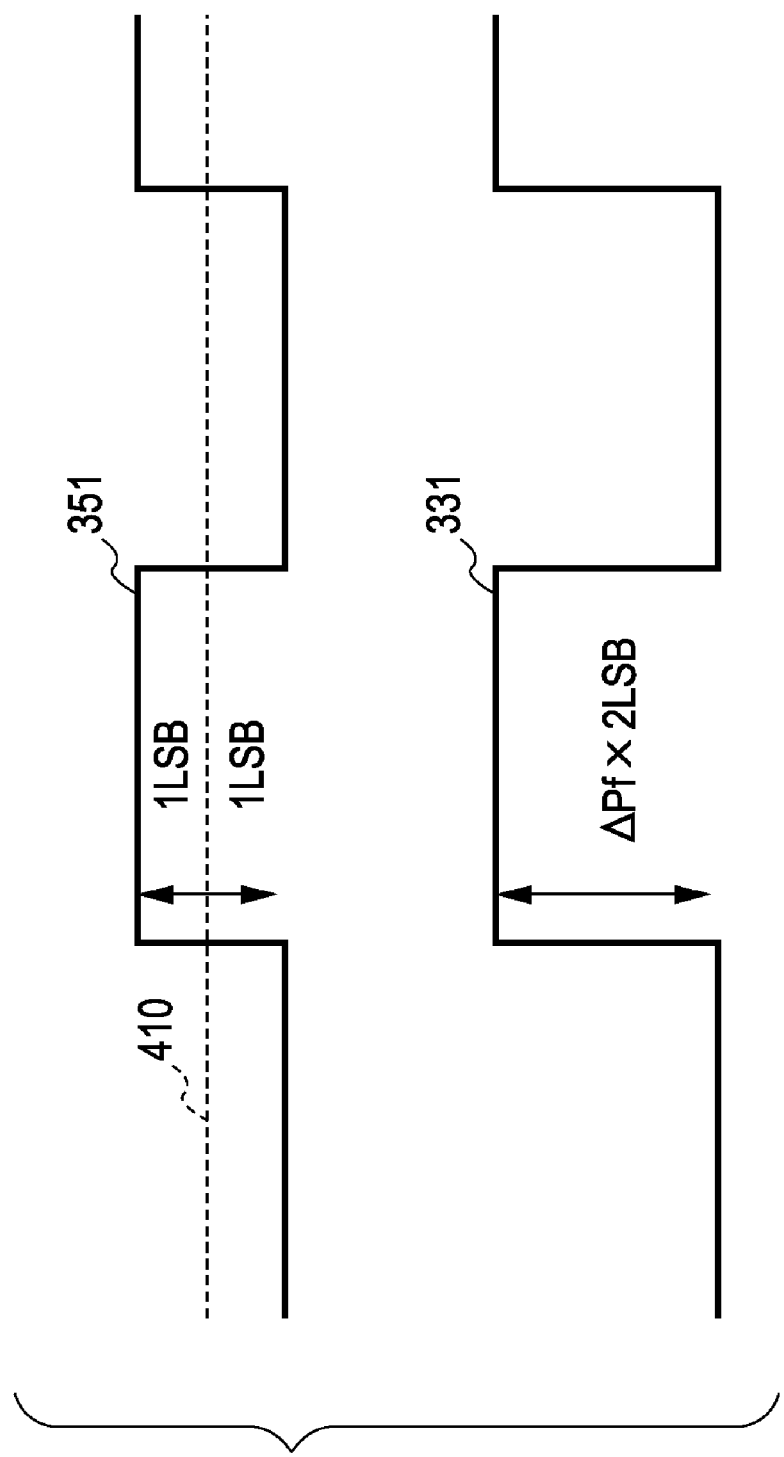
FIG. 4 is a waveform chart of a pilot signal and an electric signal.

FIG. 4 is a waveform chart of the pilot signal and the electric signal. In FIG. 4, a dotted line 410 represents the value of the intensity control signal output from the MPU 350. As shown in FIG. 4, the pilot signal 351, which is superimposed on the intensity control signal by the MPU 350, repeats a value obtained by increasing the value of the intensity control signal by 1LSB and a value obtained by subtracting 1LSB from the value of the intensity control signal. For this reason, the amplitude of the pilot signal 351 becomes 2LSB.

The amplitude of the electric signal 331 output from the digital converter 340 is obtained by multiplying a change amount ΔPf of the intensity Pf of the output light from the LD 321 at the time of changing the intensity control signal by 1LSB by the amplitude of the pilot signal 351. For this reason, the amplitude of the electric signal 331 is obtained by ΔPf× 2LSB, and it is correlated with the intensity characteristics (unit change amount ΔPf×1LSB=ΔPf) with respect to the intensity control signal of the LD 321.

The voltage control by the MPU 350 is described here. Differential efficiency of the LD 321 (the intensity characteristics with respect to the bias current) is denoted by η[μW/mA], a voltage-current conversion coefficient of the bias current driving section 381 is denoted by A [mA/mV], the voltage of the bias current output from the analog converter 370 is denoted by Vdac1 [mV], the reference voltage output from the variable power source 360 is denoted by Vref [mV], and a code (8 bits) of the intensity control signal output from the MPU 350 is denoted by DAC_code1 [LSB]. At this time, the intensity Pf [μW] of the output light from the LD 321 can be expressed by the following formula (1):

$$Pf = \eta \times A \times Vdac1 \qquad (1)$$
$$= \eta \times A \times Vref \times DAC\_code1 / (2^8 - 1)$$

The differential efficiency η changes according to the temperature fluctuation. However, the MPU 350 controls the reference voltage Vref of the variable power source 360 so that η×Vref becomes essentially constant. Specifically, the MPU 350 acquires the amplitude of the electric signal 331 output from the digital converter 340. The amplitude of the electric signal 331 is correlated with η×Vref. For this reason, the MPU 350 controls the reference voltage output from the variable power source 360 so that the amplitude of the electric signal 331 becomes essentially constant.

The extinction ratio control by the MPU 350 is described below. The intensity of the light signal "1" output from the LD 321 is denoted by Phigh[μW], the intensity of the light signal "0" is denoted by Plow[μW], the voltage-current conversion coefficient of the pulse current driving section 382 is denoted by B[mA/mV], the voltage of the pulse current output from the analog converter 370 is denoted by Vdac2[mV], and the code (8 bits) of the extinction ratio control signal output from the MPU 350 is denoted by DAC_code2[LSB]. In this case, the pulse current Ip[mA] output to the LD 321 can be expressed by the following formula (2):

$$Ip = (Phigh - Plow)/\eta \qquad (2)$$
$$= B \times Vdac2$$
$$= B \times Vref \times DAC\_code2 / (2^8 - 1)$$

The formula (2) is converted so as to become the following formula (3):

[Formula 3] (3)

In the case where the MPU 350 calculates the unit change amount ΔPf×1LSB=ΔPf based on the acquired amplitude ΔPf×2LSB, the MPU 350, does not calculate the unit change amount ΔPf but may control the reference voltage output from the variable power source 360 so that the acquired amplitude ΔPf×2LSB becomes essentially constant. Since η×Vref in the formula (3) is kept essentially constant due to this control, even if η changes, the essentially constant control of the extinction ratio with the fixed value DAC_code2 is enabled.

Figure 5:
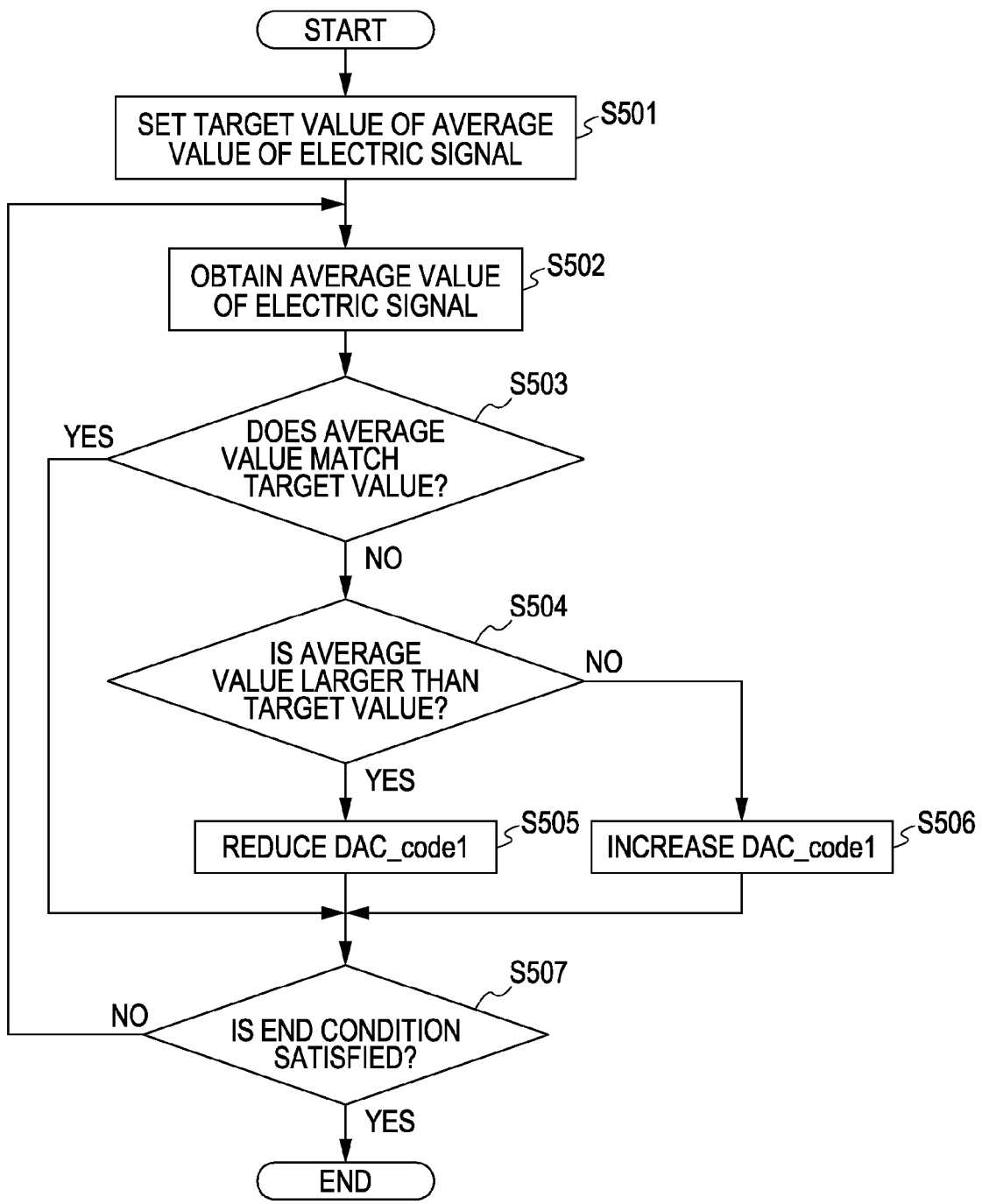
FIG. 5 is a flow chart illustrating an example of intensity control of an MPU.

FIG. 5 is a flow chart illustrating one example of the intensity control of the MPU. As shown in FIG. 5, the MPU 350 sets a target value of the average value of the electric signal 331 output from the digital converter 340 (step S501). The MPU 350 sets the target value of the average value of the electric signal 331 according to a target value of the intensity of the output light from the LD 321. The MPU 350 obtains the average value of the electric signal 331 output from the digital converter 340 (step S502).

The MPU 350 determines whether or not the average value of the electric signal 331 obtained at step S502 matches the target value set at step S501 (step S503). When the average value matches the target value (Yes at step S503), the process goes to step S507. When the average value does not match the target value (No at step S503), the MPU 350 determines whether or not the average value of the electric signal 331 obtained at step S502 is larger than the target value set at step S501 (step S504).

When the average value is larger than the target value at step S504 (Yes at step S504), the MPU 350 reduces the intensity control signal DAC_code1 output to the analog converter 370 (step S505), and the process goes to step S507. When the average value is smaller than the target value (No at step S504), the MPU 350 increases the intensity control signal DAC_code1 output to the analog converter 370 (step 506), and the process goes to step S507.

The MPU 350 determines whether or not a given end condition is satisfied (step S507). When the given end condition is not satisfied (No at step S507), the process goes to step S502. When the end condition is satisfied (Yes at step S507), the MPU 350 ends the intensity control sequence. At steps 502 to S507, the intensity of the output light from the LD 321 can be controlled so as to be an essentially constant intensity according to the target value set at step S501.

Figure 6:
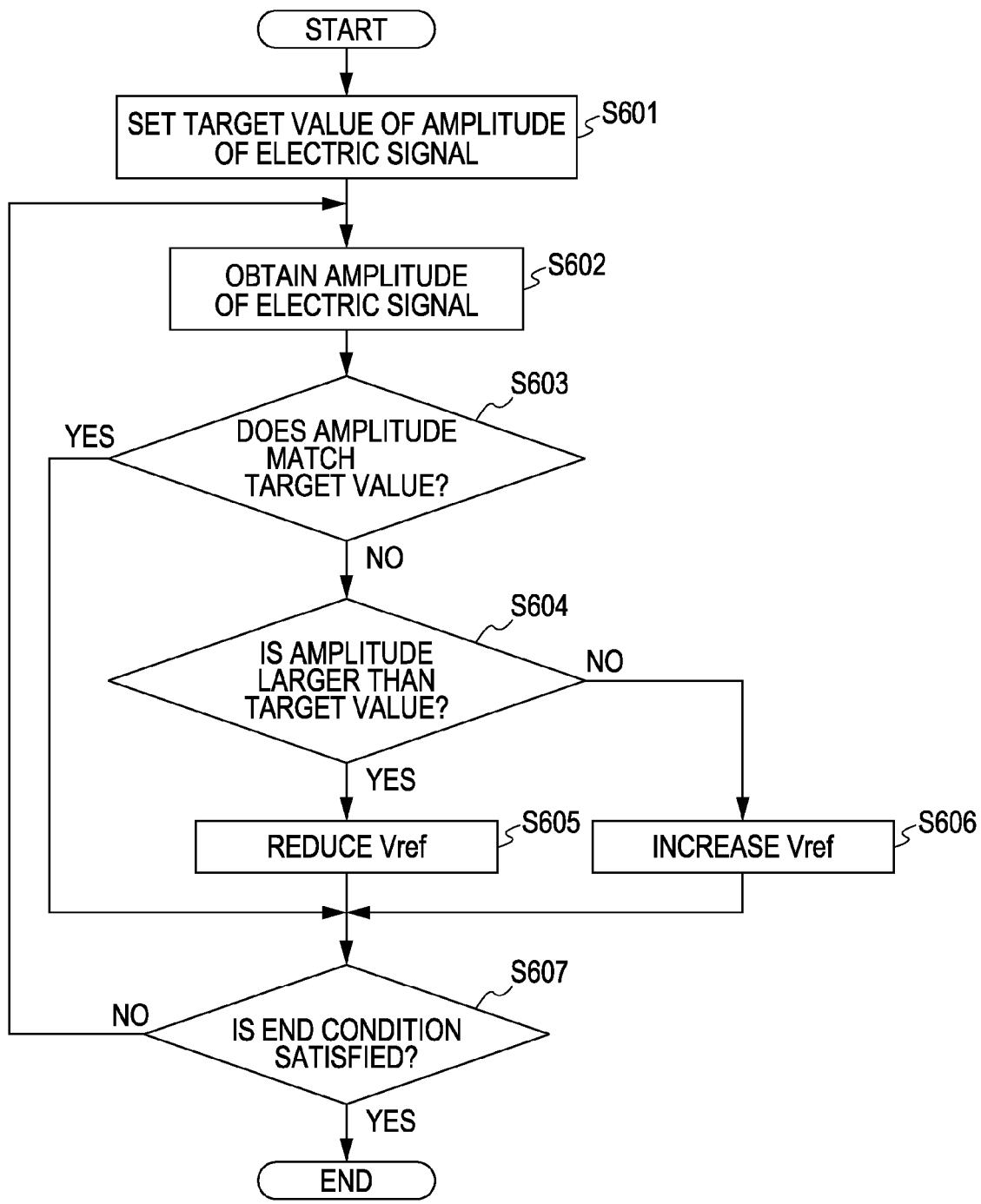
FIG. 6 is a flow chart illustrating another example of voltage control of an MPU.

FIG. 6 is a flow chart illustrating one example of the voltage control in the MPU. As shown in FIG. 6, the MPU 350 sets a target value of the amplitude of the electric signal 331 output from the digital converter 340 (step S601). The MPU 350 sets the target value of the amplitude of the electric signal 331 according to a target value of the intensity characteristics of the intensity control signal of the LD 321. The MPU 350 obtains the amplitude of the electric signal 331 output from the digital converter 340 (step S602).

The MPU 350 determines whether or not the amplitude of the electric signal 331 obtained at step S602 matches the target value set at step S601 (step S603). When the amplitude matches the target value (Yes at step S603), the process goes to step S607. When the amplitude does not match the target value (No at step S603), the MPU 350 determines whether or not the amplitude of the electric signal 331 obtained at step S602 is larger than the target value set at step S601 (step S604).

When the amplitude is larger than the target value at step S604 (Yes at step 604), the MPU 350 decreases the reference voltage Vref of the variable power source 360 (step S605), and the process goes to step S607. When the amplitude is not larger than the target value (No at step S604), the MPU 350 increases the reference voltage Vref (step S606), and the process goes to step S607. The MPU 350 determines whether or not a given end condition is satisfied (step S607).

When the end condition is not satisfied at step S607 (No at step S607), the process returns to step S602. When the end condition is satisfied (Yes at step S607), the voltage control sequence is ended. At steps S602 to S607, the intensity characteristics of the intensity control signal of the LD 321 can be controlled to maintain essentially constant intensity characteristics according to the target value set at step S601.

Figure 7:
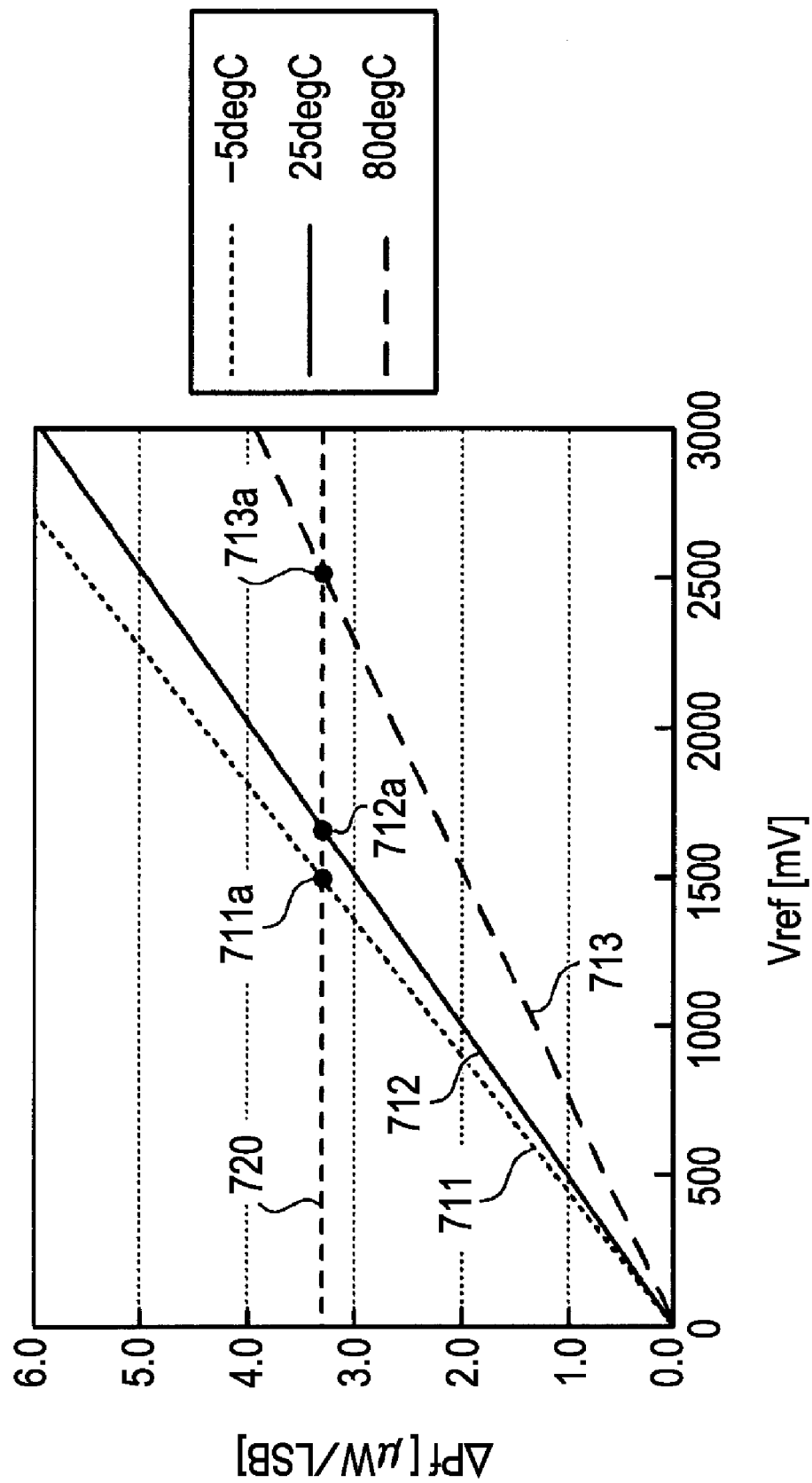
FIG. 7 is a graph illustrating a relationship between a reference voltage Vref and a unit change amount ΔPf.

FIG. 7 is a graph illustrating a relationship between the reference voltage Vref and the unit change amount ΔPf. In FIG. 7, an abscissa axis represents the reference voltage Vref [mV] of the variable power source 360. An ordinate axis represents the unit change amount ΔPf[μW/LSB] of the intensity with respect to the intensity control signal of the LD 321. A characteristic line 711, a characteristic line 712, and a characteristic line 713 represent the characteristics of the unit change amount ΔPf with respect to the reference voltage Vref when the temperature of the LD 321 is −5° C., 25° C., and 80° C., respectively. A dotted line 720 represents a desirable unit change amount ΔPf.

As shown in FIG. 7, when the temperature of the LD 321 changes into −5° C., 25° C., and 80° C., respectively, the characteristics of the unit change amount ΔPf with respect to the reference voltage Vref change as shown by the characteristics lines 711, 712, and 713. The MPU 350 controls the reference voltage Vref so that the unit change amount ΔPf always obtains a value shown on the dotted line 720 (reference symbols 711a, 712a, and 713a). Since the MPU 350 controls the reference voltage Vref based on the amplitude of the electric signal 331, information about the temperature of the LD 321 does not need to be acquired.

Figure 8:
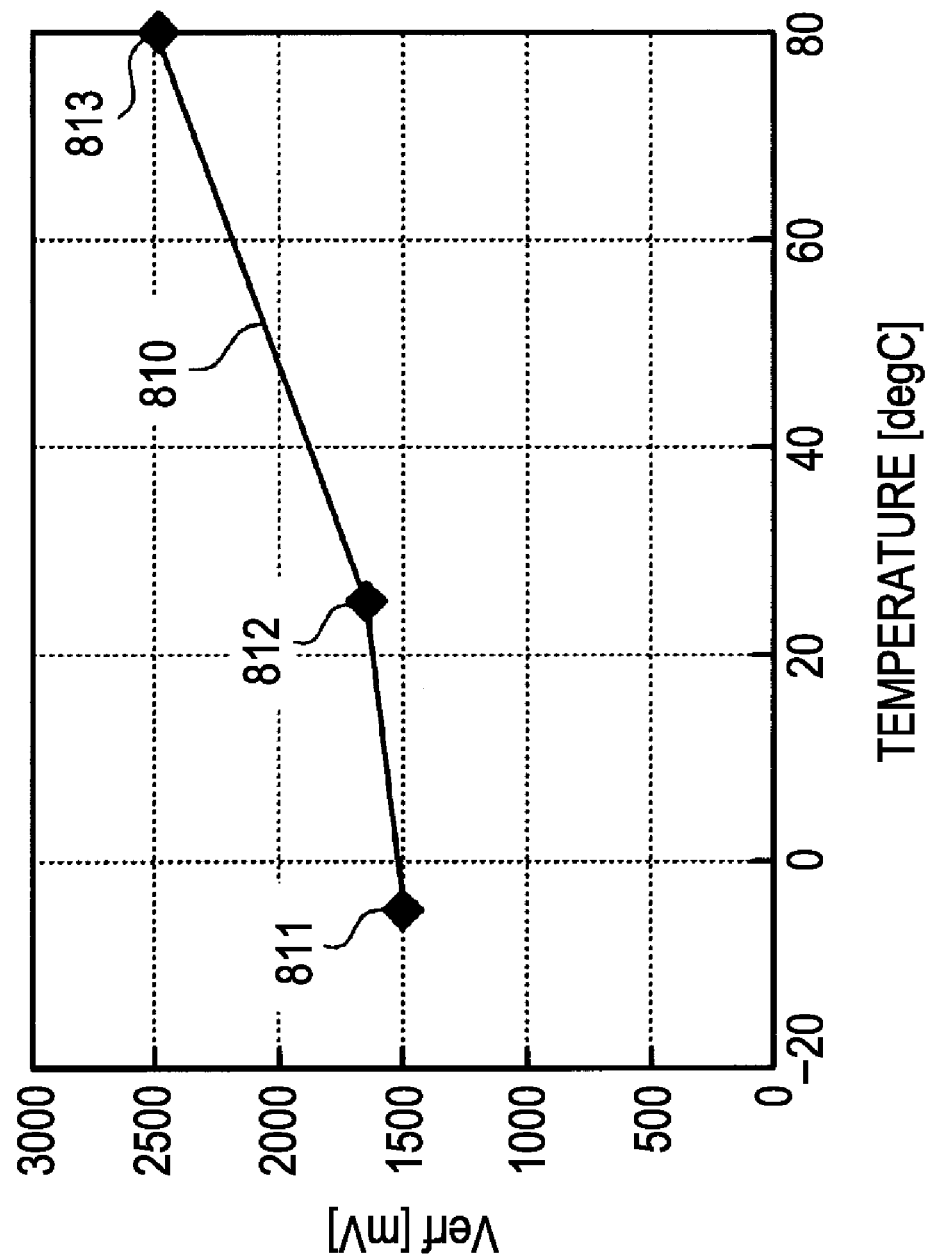
FIG. 8 is a graph illustrating a relationship between a temperature of LD and the reference voltage Vref.

FIG. 8 is a graph illustrating a relationship between the temperature of the LD and the reference voltage Vref. In FIG. 8, an abscissa axis represents the temperature [° C.] of the LD 321. An ordinate axis represents the reference voltage Vref [mV] of the variable power source 360. A characteristic line 810 represents a relationship between a change in the temperature of the LD 321 and a control value of the reference voltage Vref controlled by the MPU 350.

For example, when the temperature of the LD 321 is −5° C., the MPU 350 maintains the reference voltage Vref at about 1500 [mV] (reference symbol 811). When the temperature of the LD 321 is 25° C., the MPU 350 maintains the reference voltage Vref at about 1700 [mV] (reference symbol 812). When the temperature of the LD 321 is 80° C., the MPU 350 maintains the reference voltage Vref at about 2500 [mV] (reference symbol 813).

Figure 9:
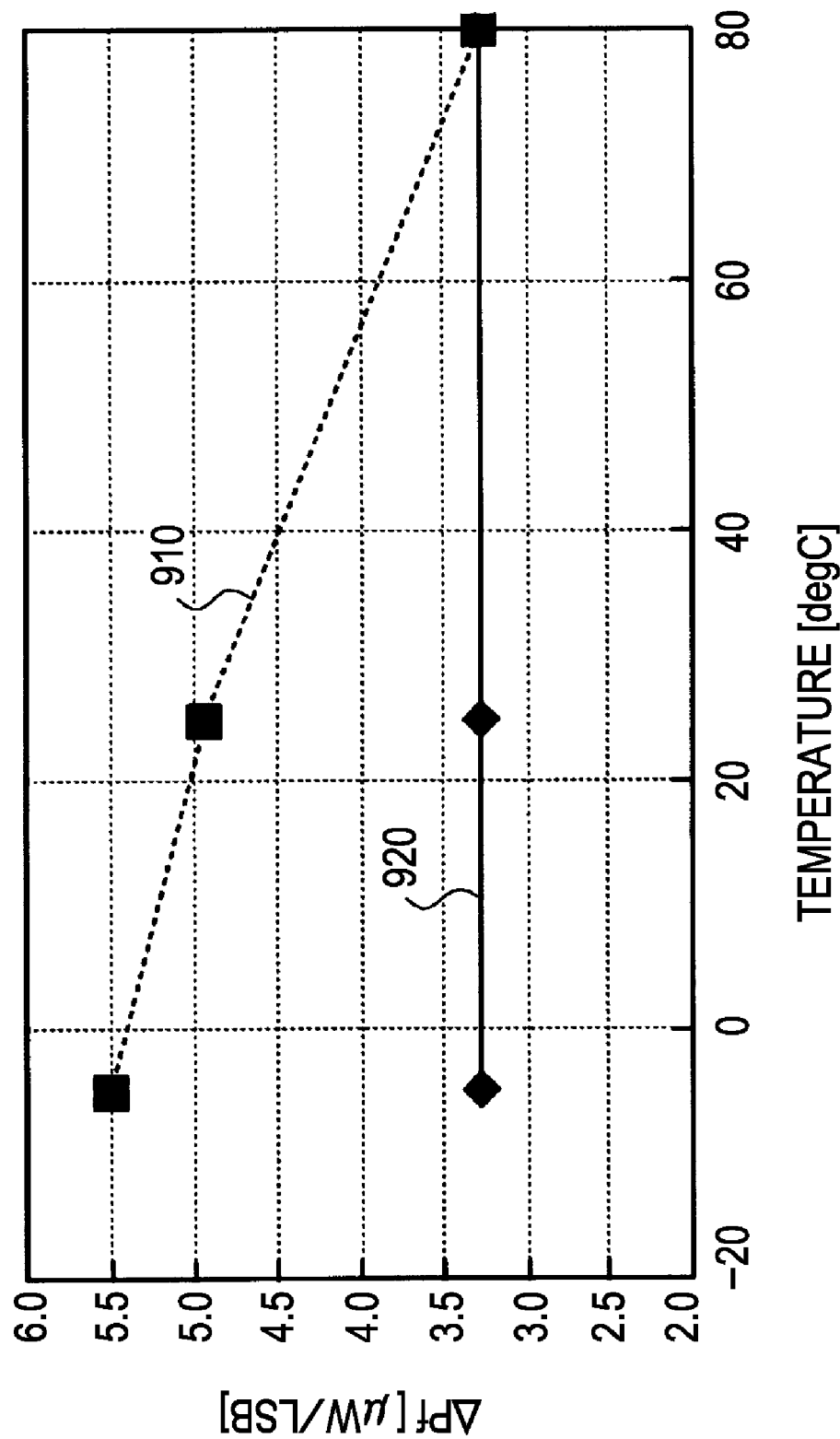
FIG. 9 is a graph illustrating a relationship between the temperature of LD and the unit change amount ΔPf.

FIG. 9 is a graph illustrating a relationship between the temperature of the LD and the unit change amount ΔPf. In FIG. 9, an abscissa axis represents the temperature [° C.] of the LD 321. An ordinate axis represents the unit change amount ΔPf [μW/LSB]. A characteristic line 910 represents the characteristics of the unit change amount ΔPf with respect to the temperature of the LD in a conventional light source driving apparatus. As shown by the characteristic line 910, in the conventional light source driving apparatus, when the temperature of the LD changes, the unit change amount ΔPf also changes.

A characteristic line 920 represents the characteristics of the unit change amount ΔPf with respect to the temperature of the LD 321. The MPU 350 of the light source driving apparatus 100 controls the reference voltage Vref so that the unit change amount ΔPf becomes essentially constant. For this reason, as shown by the characteristic line 920, even when the temperature of the LD 321 changes, the unit change amount ΔPf does not substantially change.

Figure 10:
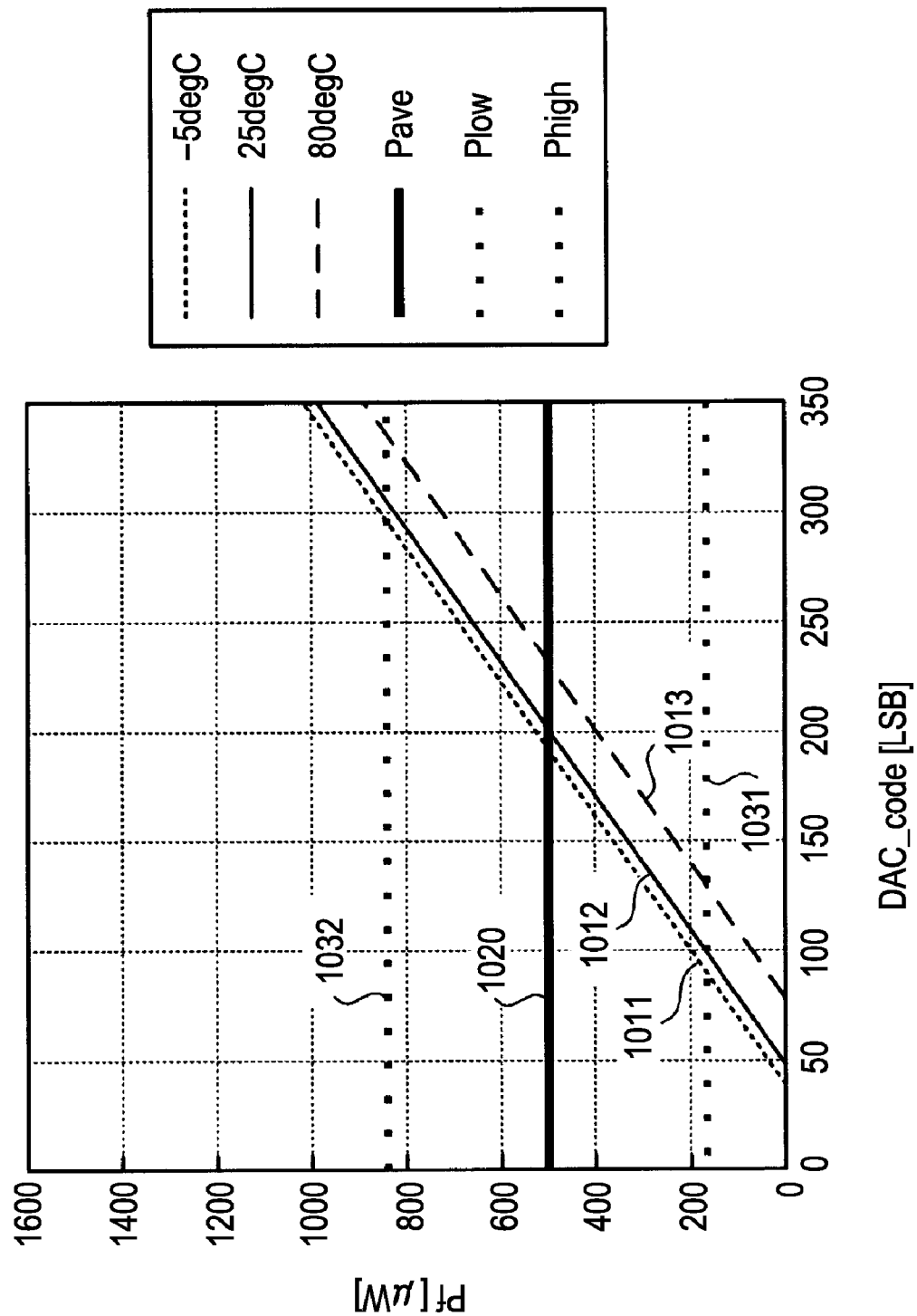
FIG. 10 is a graph illustrating a relationship between an intensity control signal and a change amount of the intensity of LD.
Figure 11:
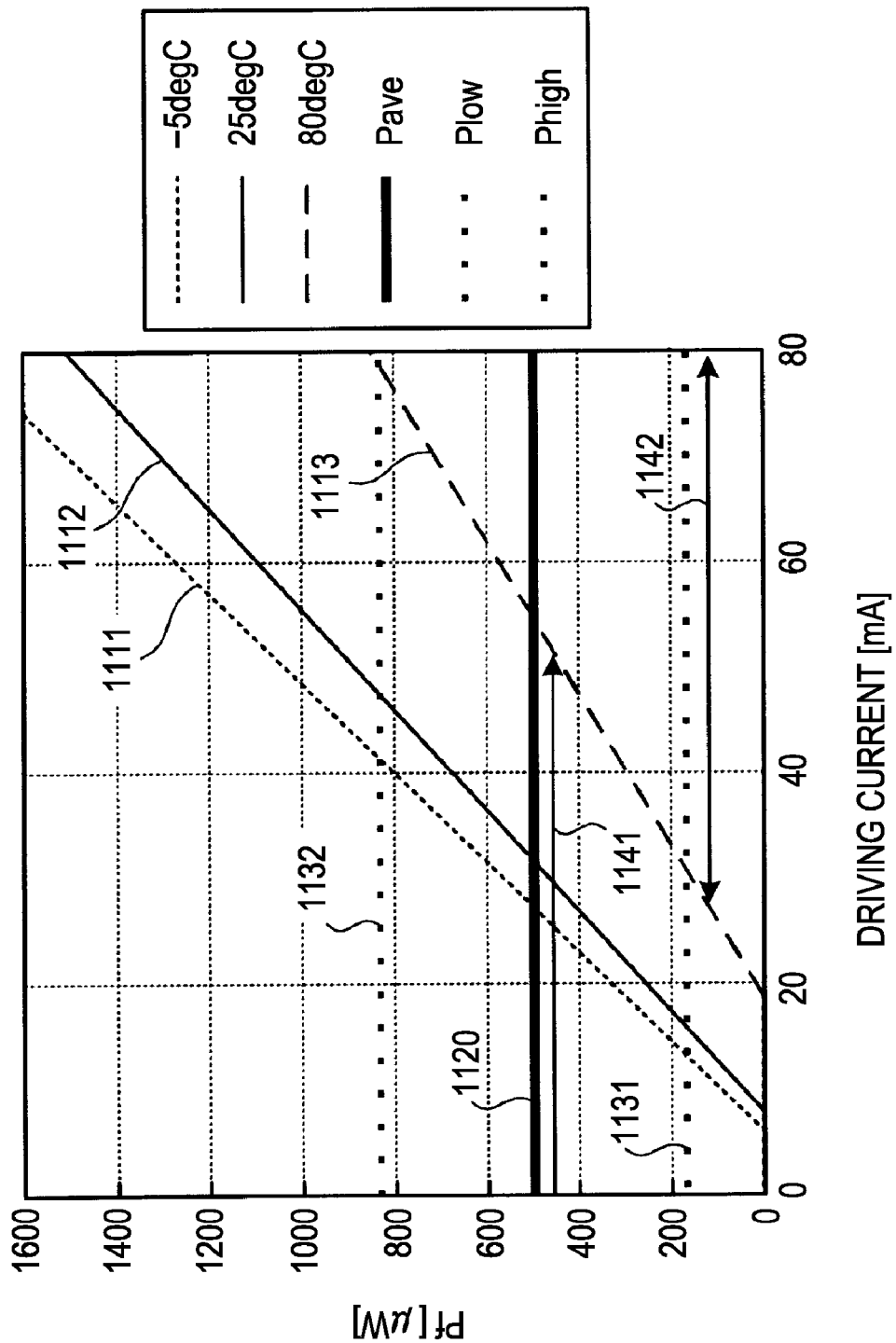
FIG. 11 is a graph illustrating a relationship between a driving current of LD and intensity of output light.
Figure 12:
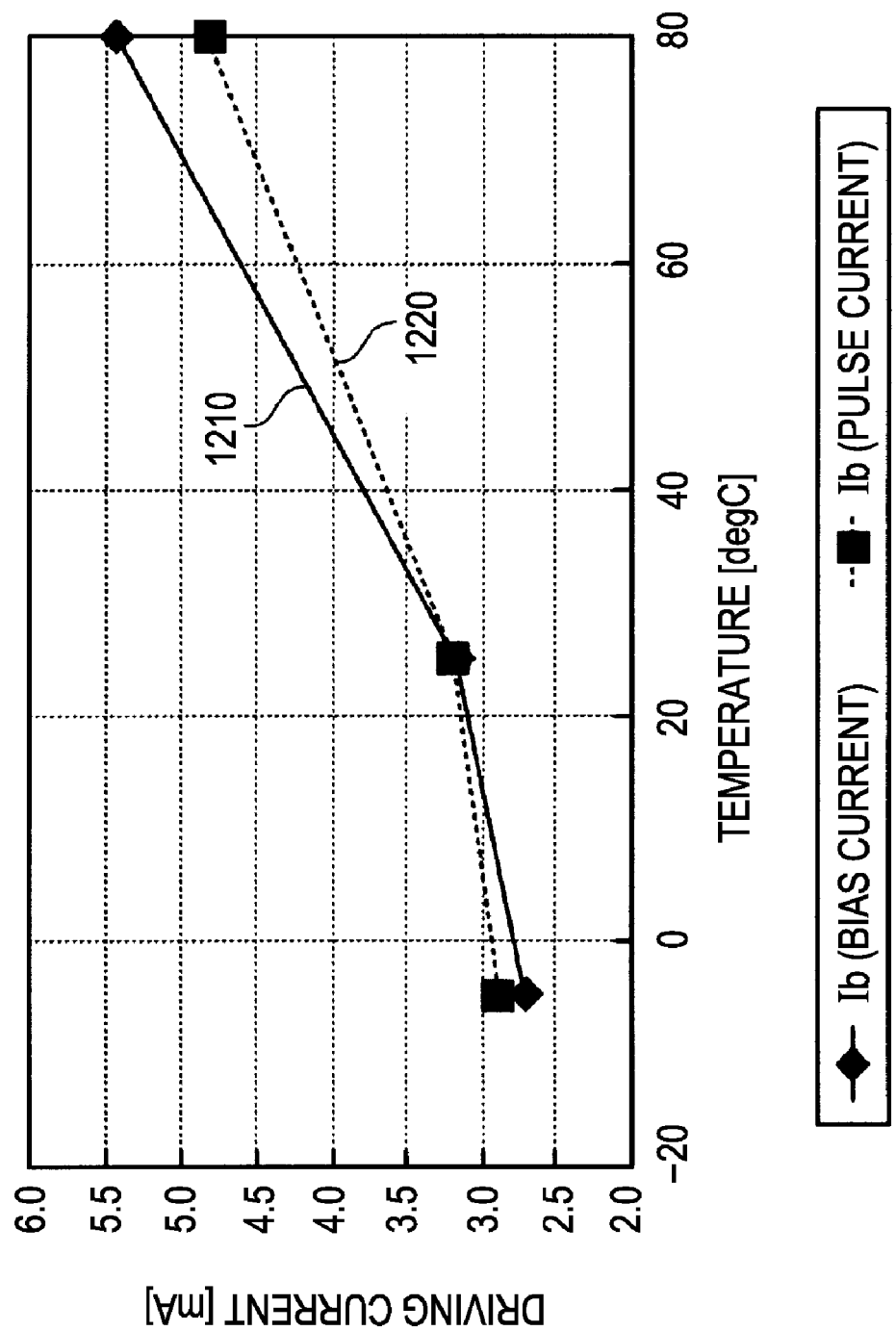
FIG. 12 is a graph illustrating control of the driving current for stabilizing average intensity and an extinction ratio.
Figure 13:
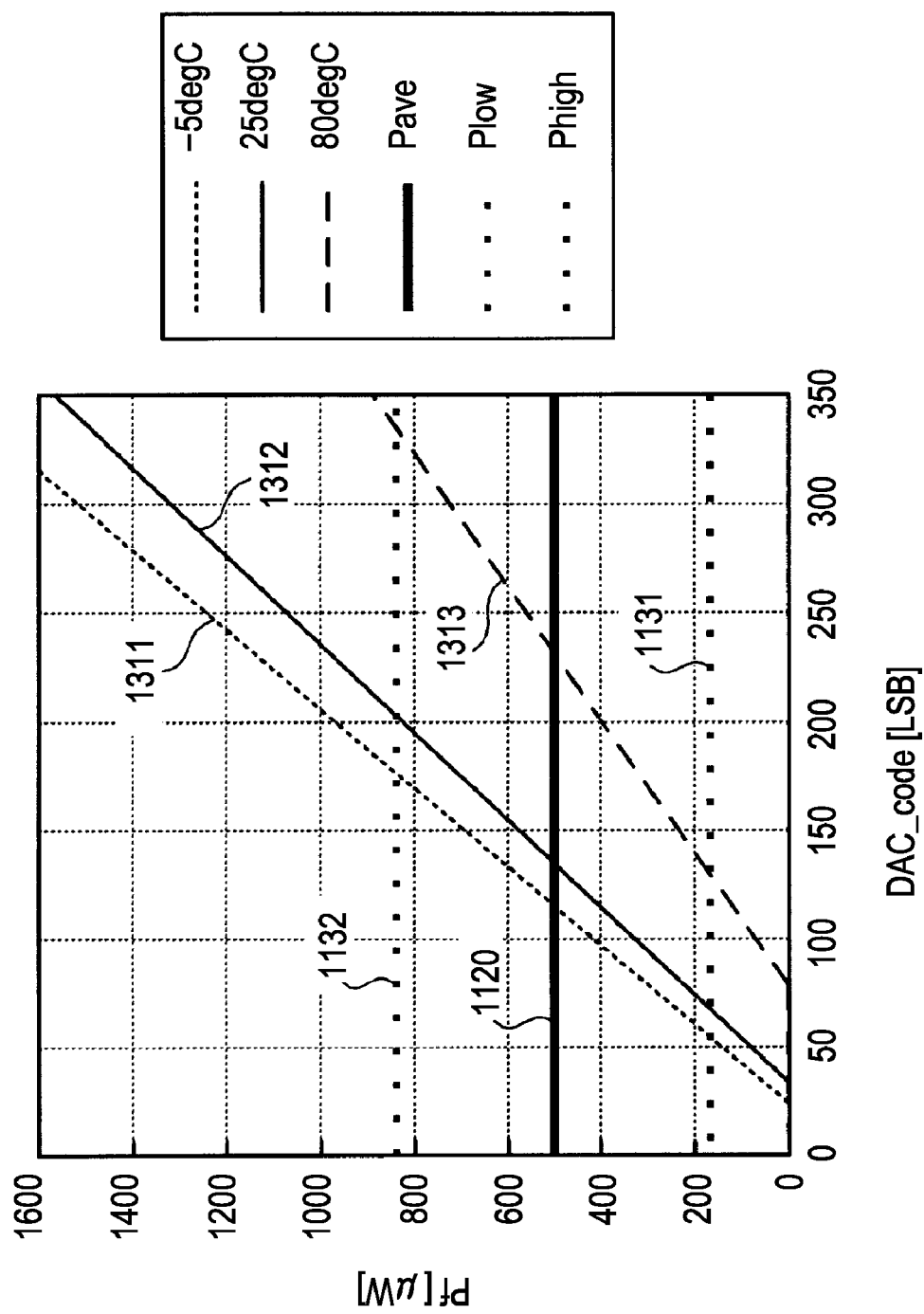
FIG. 13 is a graph illustrating a relationship between the control signal and the intensity of the output light.

FIG. 10 is a graph illustrating a relationship between the intensity control signal and a change amount of the intensity of the LD. In FIG. 10, an abscissa axis represents a code DAC_code [LSB] of the control signal output from the MPU 350. An ordinate axis represents the intensity Pf [μW] of the output light from the LD 321. The control signals output from the MPU 350 are an intensity control signal and an extinction ratio control signal.

Characteristic lines 1011, 1012, and 1013 represent characteristics of the intensity Pf with respect to the control signal at the time when the temperature of the LD 321 is −5° C., 25° C., and 80° C., respectively. A thick line 1020 represents average intensity (Pave) of the light output from the LD 321. A dotted line 1031 represents intensity (Plow) at the time of the light signal "0." A dotted line 1032 represents intensity (Phigh) at the time of the light signal "1."

As shown by the characteristic lines 1011, 1012, and 1013, even when the temperature of the LD 321 changes, the intensity change amount of the output light per control signal 1LSB does not change. For this reason, even when the intensity characteristics with respect to the driving current of the LD 321 change due to temperature fluctuation, the intensity characteristics of the signal light with respect to the control signal can be kept essentially constant. For this reason, even when the intensity characteristics with respect to the driving current change due to temperature fluctuation, the intensity control using the intensity control signal and the extinction ratio control using the extinction ratio control signal can be stabilized.

The light source driving apparatus 100 according to the second embodiment produces the effect of the light source driving apparatus 100 according to the embodiment 1 while the pulse current supplied to the signal light source 210 is generated by using the reference voltage controlled by the voltage control section 180, so that the extinction ratio characteristics of the signal light with respect to the extinction ratio control signal can be kept essentially constant. For this reason, even when the extinction ratio characteristics with respect to the pulse current change due to the temperature fluctuation, the extinction ratio control of the signal light source 210 using the extinction ratio control signal can be stabilized.

The pulse current supplied to the signal light source 210 is generated by using the reference voltage controlled by the voltage control section 180, so that the value of the extinction ratio control signal can be set to a fixed value. For this reason, the extinction ratio of the output light from the signal light source 210 can be made to be essentially constant by simple control without providing a temperature sensor and without acquiring information about the temperature characteristics of the differential efficiency of the respective signal sources 210 in advance.

As described above, with the light source driving apparatus 100 according the respective embodiments, the intensity control of the light source can be stabilized. Also when the extinction ratio control of the light source is made, the extinction ratio control can be stabilized. The second embodiment describes the case where the light source 110 shown in FIG. 1 is composed of the LD 321, but various light sources such as LED (Light Emitting Diode) can be applied to the light source 110.

The light source driving apparatus and the light source driving method according to the respective embodiments described above are effective for a light source driving apparatus and a light source driving method which adjust a bias current to be supplied so as to control the intensity of a light source. Particularly, they are suitable for the case where the temperature fluctuation of the light source is generated.

What is claimed is:

1. A light source driving apparatus which adjusts a bias current to be supplied so as to control intensity of a light source, comprising:

a power source which outputs a variable reference voltage;

a light receiving unit which receives light output from the light source and converts the light into an electric signal;

a bias supply unit which supplies a bias current, which is based on an intensity control signal according to the electric signal converted by the light receiving unit and the reference voltage output from the power source, to the light source;

a voltage control unit which acquires information about intensity characteristics with respect to the intensity control signal of the light source and controls the variable reference voltage according to the acquired information about the intensity characteristics; and an extracting unit which extracts a component of the frequency of the electric signal converted by the light receiving unit as an extracted electrical signal;

wherein the voltage control unit controls the variable reference voltage according to an amplitude of the extracted electric signal that provides the information about the intensity characteristics, and the voltage control unit controls the reference voltage so that the amplitude of the extracted electric signal becomes essentially constant; and wherein the bias supply unit supplies the bias current obtained by multiplying the reference voltage by the intensity control signal, which is a digital signal, to the light source.

2. The light source driving apparatus according to claim 1, further comprising:

a superimposing unit which superimposes, on the intensity control signal, a signal with a frequency different from that of the intensity control signal.

3. A light source driving method for adjusting a bias current to be supplied so as to control intensity of a light source, comprising:

receiving light output from the light source and converting the light into an electric signal;

supplying a bias current, which is based on an intensity control signal according to the converted electric signal and a variable reference voltage, to the light source;

acquiring information about intensity characteristics with respect to the intensity control signal of the light source so as to control the variable reference voltage according to the acquired information about the intensity characteristics;

extracting a component of the frequency of the converted electric signal as an extracted electrical signal that provides information about the intensity characteristics;

controlling the variable reference voltage according to an amplitude of the extracted electric signal; and controlling the variable reference voltage so that the amplitude of the extracted electric signal becomes essentially constant;

wherein the supplying the bias current includes supplying the bias current obtained by multiplying the reference voltage by the intensity control signal, which is a digital signal, to the light source.

* * * * *